United States Patent
Murakami et al.

[11] Patent Number: 6,116,187
[45] Date of Patent: Sep. 12, 2000

[54] THIN FILM FORMING APPARATUS

[75] Inventors: Hiroshi Murakami; Takashi Mikami; Kiyoshi Ogata, all of Kyoto, Japan

[73] Assignee: Nissin Electric Co., Ltd., Kyoto, Japan

[21] Appl. No.: 09/315,145

[22] Filed: May 20, 1999

[30] Foreign Application Priority Data

May 22, 1998 [JP] Japan .................... 10-158395

[51] Int. Cl.⁷ .................... C23C 16/00
[52] U.S. Cl. .................... 118/723 FI; 118/723 E; 118/723 I; 118/723 MW; 118/723 AN; 156/345
[58] Field of Search .................... 118/723 R, 723 I, 118/723 IR, 723 E, 723 ER, 723 MW, 723 MR, 723 MA, 723 ME, 723 AN, 723 MP, 723 FI; 156/345; 204/298.04, 298.36

[56] References Cited

U.S. PATENT DOCUMENTS 4,599,135  7/1986  Tnusekawa et al. ............ 156/643
4,874,459  10/1989  Coldren et al. ............ 156/643
5,132,105  7/1992  Remo ............ 423/446

FOREIGN PATENT DOCUMENTS 5-55194  3/1993  Japan .

*Primary Examiner*—Marian C. Knode
*Assistant Examiner*—Luz Alejandro
*Attorney, Agent, or Firm*—Finnegan, Henerson, Farabow, Garrett & Dunner, L.L.P.

[57] ABSTRACT

A thin film forming apparatus has a vacuum chamber as a film forming chamber, a plasma generating unit and an ion source. In the vacuum chamber, a substrate is placed and a thin film is formed on the substrate. The plasma generating unit decomposes a source gas introduced into the vacuum chamber to generate a plasma of the source gas near a film-forming surface of the substrate within the vacuum chamber. The ion source is provided around the vacuum chamber. The ion source produces ion beams that are drawn out to be directed substantially parallel to the film-forming surface of the substrate to irradiate the plasma.

3 Claims, 4 Drawing Sheets

THIN FILM FORMING APPARATUS

BACKGROUND OF THE INVENTION

1. Field of the Invention

The present invention relates to a thin film forming apparatus which irradiates ion beam to a plasma of source gas while controlling the irradiation to a substrate so that the particles such as ions or radicals in the plasma are sufficiently energized to form a deposit of crystalline thin film on the substrate.

2. Description of the Related Art

A typical example of the thin film forming apparatus which is an application of the CVD apparatus is described in Unexamined Japanese Patent Publication (kokai) No. Hei 5-55194 (HO1L 21/31). A high-frequency plasma of source gas is formed within a film forming chamber while, at the same time, ion beams from an ion source are directed into the film forming chamber to irradiate the high-frequency plasma and the surface of a substrate. Consequently, a uniform and homogeneous deposit of thin film is formed on the substrate at low temperature due to the migration effect of the excited species in the plasma from the beam irradiation and by the control of film quality.

The thin film forming apparatus described above is remarkably effective to form thin-film transistors in liquid-crystal display panels of TFT type and crystalline, silicon thin films in solar cells.

FIG. 6 is a schematic view of the conventional thin film forming apparatus described in the above Japanese Patent Publication. A vacuum chamber 1 is composed of a film forming chamber 2 as the lower part and an ion source 3 as the upper part. The bottom of the film forming chamber 3 is connected to a vacuum for constant evacuation.

A substrate holder 4 is provided in the lower part of the film forming chamber 2 to support a slab or plate of substrate 5 horizontally.

In the film forming chamber 2, a plasma (high-frequency plasma) 6 of source gas (reactant gas) is generated above the film-forming surface of the substrate 5 by discharging microwaves.

Ion beams 8 from the ion source 3 are drawn out from the ion source 3 via a drawing-out electrode 7 into the film forming chamber 2 underneath and pass through the plasma 6 to vertically irradiate the film-forming surface of the substrate 5.

In the drawing, reference numeral 9 designates a source gas inlet; 10, a microwave inlet; and 11, a field magnet assembly.

By the vertical irradiation of the ion beams 8, the particles such as ions or radicals in the plasma 6 are excited to a higher energy. At the same time, the substrate 5 is irradiated with the ion beams 8, whereupon the migration effect and the reaction on the surface of the substrate 5 are accelerated to form a crystalline thin film such as one of silicon on the substrate 5.

In the conventional apparatus shown in FIG. 6, the ion beams 8 are vertically irradiated to the surface of the substrate 5, i.e., in the direction of thin film deposition. Hence, particularly in the case of drawing-out the ion beams 8 at high voltage from the ion source 3, the ion beams 8 are bombarded against the substrate 5 with a great energy. Consequently, the substrate 5 may be damaged by the irradiating ion beams 8, thereby making the formation of a satisfactory thin film impossible.

SUMMARY OF THE INVENTION

It is an object of the present invention to provide a thin film forming apparatus that prevents substrate damage due to the irradiation with ion beams thereby ensuring the formation of a satisfactory thin film on the film-forming surface of a substrate.

It is another object of the present invention to maximize the throughput of irradiation of a plasma with the ion beams to offer an additional advantage such as improved crystallinity of the thin film.

A thin film forming apparatus according to the present invention comprises: a vacuum chamber as a film forming chamber in which a substrate is placed, a thin film being formed on the substrate; plasma generating means for decomposing a source gas introduced into said vacuum chamber to generate a plasma of said source gas near a film-forming surface of the substrate within said vacuum chamber; and an ion producing means, which provided around said vacuum chamber, for producing ion beams that are drawn out to be directed substantially parallel to the film-forming surface of the substrate to irradiate said plasma.

The ion beams are drawn out to be directed parallel to the film-forming surface of the substrate but do not bombard it by normal incidence. Accordingly, they will not damage the substrate, thus ensuring the formation of a satisfactory thin film on the film-forming surface of the substrate even if they are drawn out at high voltage.

In the thin film forming apparatus, said ion producing means comprises a plurality of ion sources which is provided at a plurality of sites around said vacuum chamber so that the plasma near the film-forming surface of the substrate is irradiated with the ion beams coming from a plurality of radial directions.

The ion beams irradiate the plasma above the substrate from a plurality of radial directions to be directed parallel to the substrate. Accordingly, they bombard the substrate surface to a minimal extent but extensively irradiate the plasma above the substrate so that the particles in the plasma are sufficiently excited to offer another advantage such as a further improvement in the crystallinity of the deposited thin film.

Alternatively, in the thin film forming apparatus, said ion producing means is an ion source that is provided in an annular form surrounding said vacuum chamber so that the plasma near the film-forming surface of the substrate is irradiated with the ion beams coming from all radial directions.

The ion beams irradiate the plasma above the substrate from all radial directions to be directed parallel to the substrate, they also bombard the substrate surface to a minimal extent but quite extensively irradiate the plasma above the substrate to offer an additional advantage such as an even greater improvement in the crystallinity of the deposited thin film.

PREFERRED EMBODIMENT OF THE INVENTION

Preferred embodiments of the present invention will be described with reference to FIGS. 1 to 5.

First Embodiment

Figure 1:
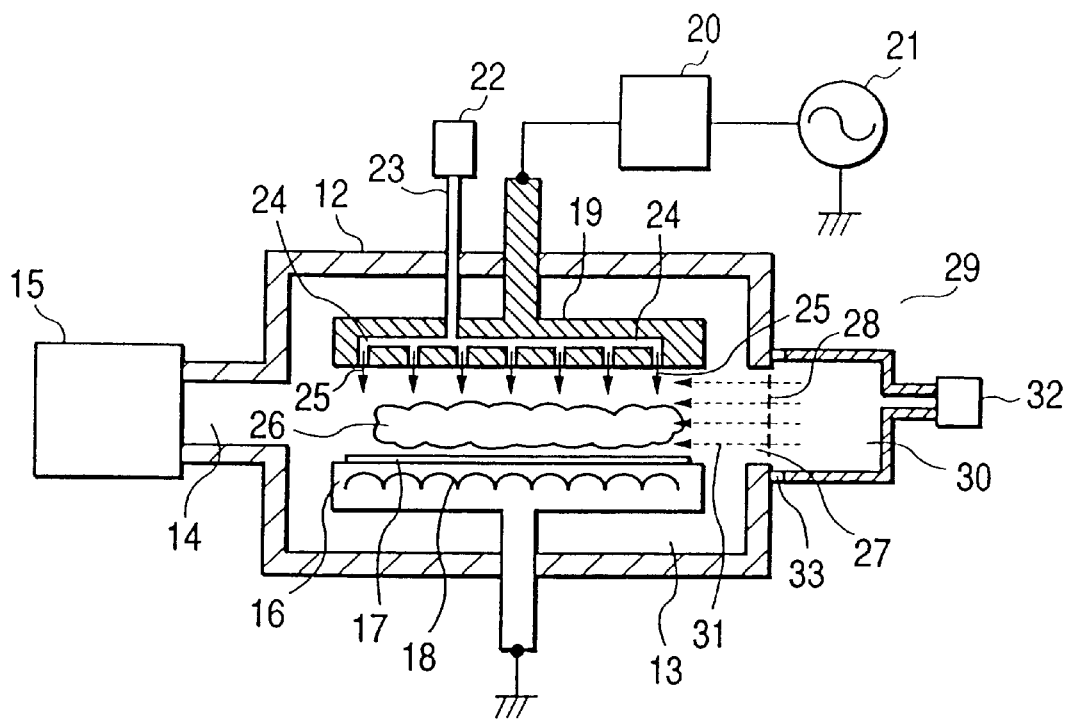
FIG. 1 is a vertical section view of a thin film forming apparatus according to a first embodiment of the invention.

A first embodiment of the invention is described with particular reference to FIG. 1.

Figure 6:
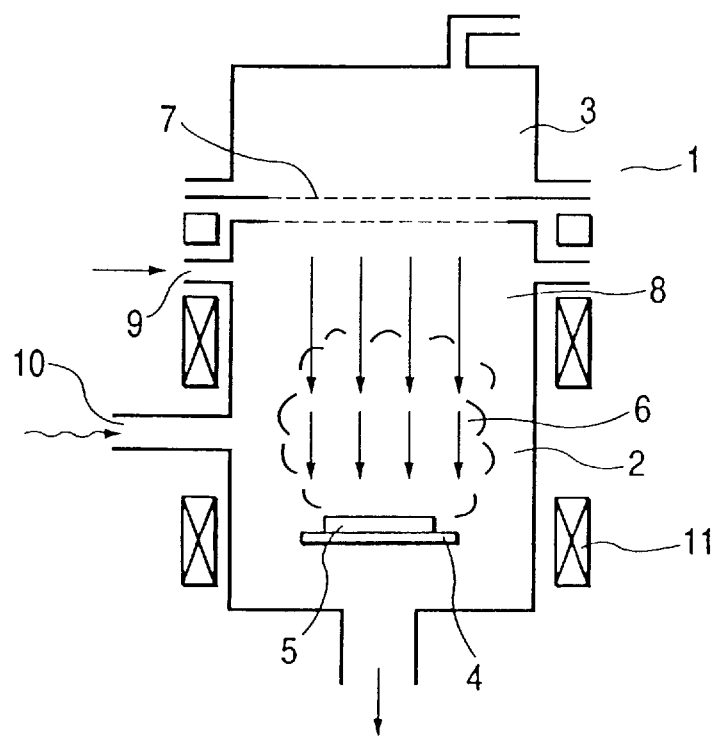
FIG. 6 is a schematic diagram of a conventional thin film forming apparatus.

As shown in FIG. 1, a vacuum chamber 12 has a film forming chamber 13 corresponding to the film forming chamber 2 shown in FIG. 6. The film forming chamber 13 has gas outlet 14 on the left side which is connected to a vacuum source 15 to ensure constant evacuation.

A substrate holder 16 is provided in the lower part of the film forming chamber 13 to support a slab or plate of support 17 horizontally.

The substrate holder 16 contains a built-in heater 18 for controlling the film-forming temperature (i.e., at 300° C.) and it is grounded to the outside of the vacuum chamber 12.

A parallel-plate electrode assembly 19 is provided in the upper part of the film forming chamber 13 such that its upper end penetrates the top of the vacuum chamber 12 to project outwardly. It is connected to a high-frequency power source 21 via a matching unit 20 to be supplied with high-frequency power.

The parallel-plate electrode assembly 19 consists of two plate electrodes that are parallel to each other and spaced apart by a distance that is typically equal to the spacing between two opposite sides of the substrate 17.

A gas supply unit 22 is provided outside the vacuum chamber 12. A source gas (reactant gas) 25 is supplied from the vacuum chamber 12 into the film forming chamber 13 through a conduit 23 and perforations 24 formed in the lower part of the parallel-plate electrode assembly 19.

The source gas 25, if it is used to form a silicon thin film, is either a single gas containing, silane gas (e.g., $SiH_4$ or $Si_2H_6$) or a mixture gas of silane gas and an inert gas such as hydrogen ($H_2$), helium gas (He) or argon (Ar).

The source gas 25 introduced into the film forming chamber 13 is decomposed by high-frequency discharge due to the electric power from the high-frequency source 21, whereupon a plasma (high-frequency plasma) 26 of the source gas 25 is formed near the film-forming surface of the substrate 17.

The parallel-plate electrode assembly 19, matching unit 20, high-frequency source 21 and gas supply unit 22 are the essential components of a plasma generating unit.

A beam inlet 27 is formed on the right side of the vacuum chamber 12 in a position which is substantially between the substrate 17 and the parallel-plate electrode assembly 19. An ion source 29 has a plasma chamber 30. The beam inlet 27 is connected to an opening of the plasma chamber 30 of the ion source 29 via the drawing-out electrode 28. The ion beam 31 formed by the plasma generation of microwave discharge, ECR (electron cyclotron resonance) discharge or the like in the plasma chamber is drawn parallel (horizontal) to the substrate 17 by the drawing-out electrode 28. That is, the ion beam 31 is drawn perpendicular to the direction of thin film deposition on the substrate 17.

It is not absolutely necessary to introduce a plasma generating gas into the plasma chamber 30 since the source gas introduce into the film forming chamber 13 also diffuses into the plasma chamber 30. However, if desired, a plasma generating gas may be introduced from the ion source introducing, a gas supply unit 32 as a separate entity forms the source gas.

The gas introduced into the plasma chamber 30 from the ion source introducing gas supply unit 32 should not cause any adverse effects on film formation. To this end, gas mentioned as examples of the source gas will suffice, as exemplified by single gas containing silane gas ($SiH_4$ or $Si_2H_6$) and mixtures of silane gas with hydrogen (H), helium (He) or argon (Ar). Inert gas such as hydrogen ($H_2$), helium (He) and argon (Ar) are also available.

Reference numeral 33 in FIG. 1 represents an insulator supporting the electrode 28.

The ion beams 31 drawn-out to be directed parallel to the substrate 17 do not bombard the film-forming surface of the substrate 17 but irradiate the plasma 26. Consequently, the particles in the plasma 26 going to deposit on the substrate 17 are excited by collision with the ion beams 31 and the excited high-energy particles are deposited on the substrate 17.

Since the bombardment of the ion beams 31 against the substrate 17 is prevented, the migration effect occurring on the surface of the substrate 17 is enhanced and a thin film such as one of silicon having satisfactory crystallinity can be formed on the substrate 17 without troubles such as the damage caused by the ion beams 31 being drawn-out.

Using the apparatus shown in FIG. 1, the present inventors formed a silicon thin film 3,000 Å thick on a quartz substrate heated at 300° C. and examined the crystallinity of the film with an X-ray diffractometer. A peak for crystallinity was found, verifying the satisfactory crystallinity of the thin film.

To form the thin film, a mixture of monosilane ($SiH_4$) and hydrogen ($H_2$) was used as source gas, each component being allowed to flow at 10 ccm. The gas pressure was 10 mTorr; the high-frequency power was 100W; and the ion beams 31 were drawn out at a voltage of 2 kV.

In the first embodiment, the ion beams 31 are drawn out such that they are directed parallel to the substrate 17. If the substrate 17 is made of a material that will be damaged to a comparatively small extent by irradiation with the ion beams 31, another configuration may be adopted, as exemplified by providing the ion source 29 around the vacuum chamber 12 in a higher position than the plasma 26 so that the ion beams 31 are drawn out from the plasma chamber 30 downward at an angle to ensure that the substrate 17 is irradiated with only a part of the ion beams 31.

In this alternative case, the ion beams penetrate to a smaller depth than with the conventional apparatus shown in FIG. 6 in which the ion beam is vertically irradiated on the substrate. The damage of the substrate by the ion beams being drawn out is effectively prevented. Due to the irradiation of the substrate with part of the ion beams, the reaction on the substrate surface is accelerated and the migration effect is further accelerated to offer the advantage of enabling the formation of an even more satisfactory thin film.

If the ion beams 31 are to be directed obliquely with respect to the substrate 17, the angle which should be determined in consideration of the exposed does on the substrate 17 is preferably in the range from 45° to 90° degrees (horizontal), with the direction (vertical) of film deposition on the substrate 17 being taken as zero degrees.

In the first embodiment, the plasma chamber 30 of the ion source 29 is partitioned by at least one drawing-out electrode 28, which can draw out the ion beams 31 at a constant energy, permitting their controlled irradiation. It should, however, be mentioned that the drawing-out electrode 28 is not an essential element for achieving irradiation with the ion beams 31.

If the drawing-out electrode 28 is not provided, the energy of the ion beams 31 is determined by the difference between the plasma potential of the ion source 29 and that of the substrate surface.

Second Embodiment

Figure 2:
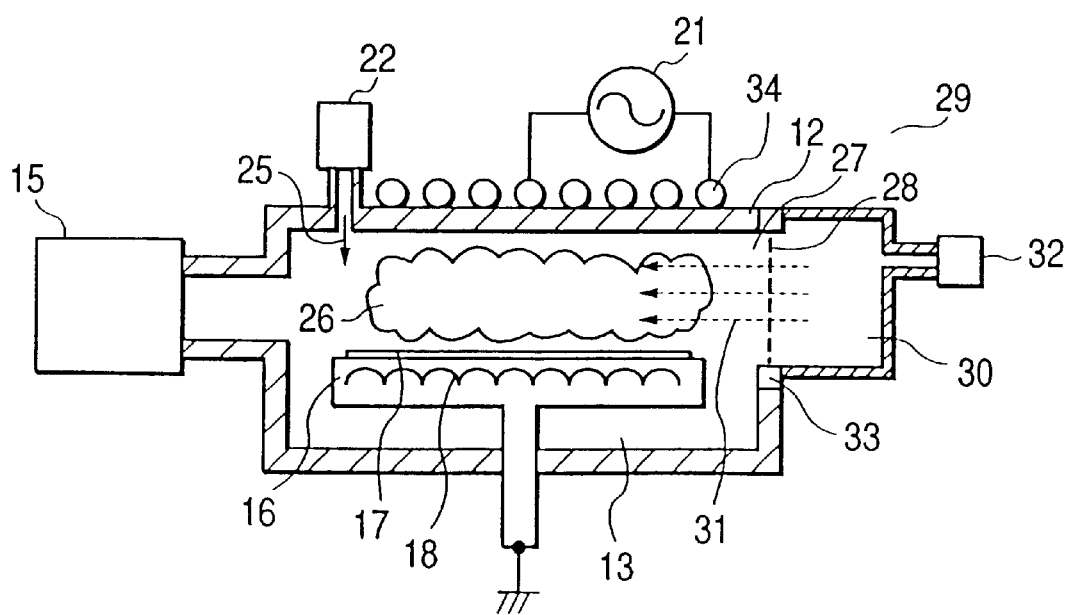
FIG. 2 is a vertical section view of a thin film forming apparatus according to a second embodiment of the invention.

A second embodiment of the invention will be described with reference to FIG. 2, which shows the case of creating a plasma using an inductively coupled coil electrode assembly instead of the parallel-plate electrode assembly 19 shown in FIG. 1. Reference numeral 34 represents an induction coil provided outside the top of the vacuum chamber 12, which is connected to the high-frequency power source 21 to form an inductively coupled coil electrode assembly.

In this second embodiment, the vacuum chamber 12 is made of an insulator.

High-frequency power is supplied to the induction coil 34 so that a plasma 26 is formed near the film forming surface of the substrate 17 and irradiated with the ion beams 31, thereby producing the same effect as in the first embodiment.

Third Embodiment

Figure 3:
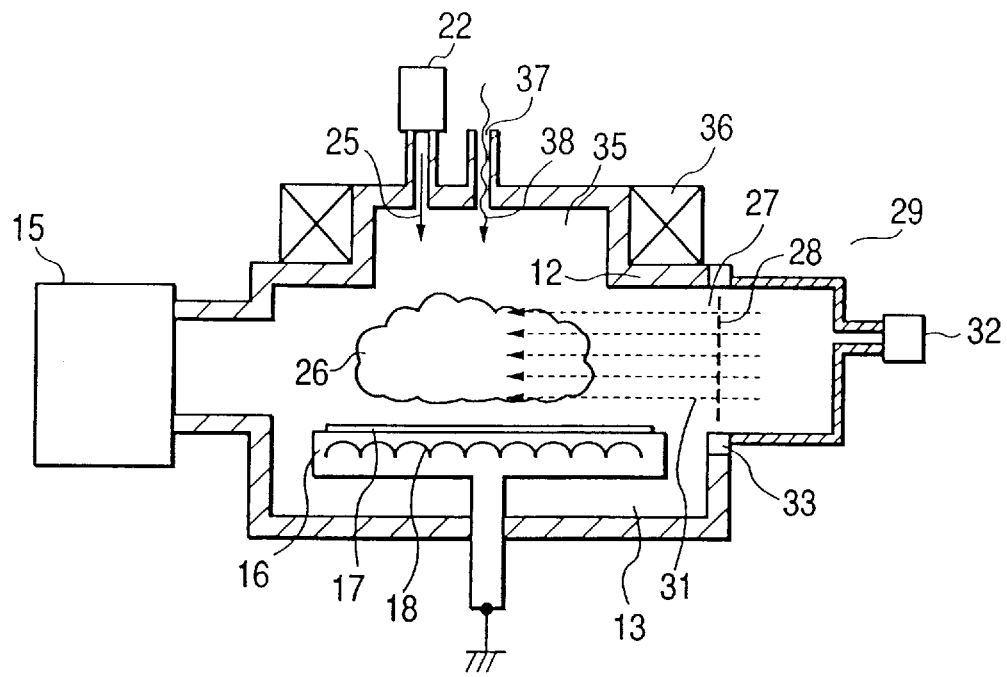
FIG. 3 is a vertical section view of a thin film forming apparatus according to a third embodiment of the invention.

We next describe the third embodiment of the invention with reference to FIG. 3, which shows the case of forming a plasma 26 by discharge with microwaves.

Reference numeral 35 in FIG. 3 designates an ECR chamber provided in the upper part of the vacuum chamber 12; 36, a field magnet assembly around the ECR chamber 35; and 37, a microwave introducing inlet to the ECR chamber 35.

If microwaves 38 are introduced into the ECR chamber 35 through the inlet 37, a discharge occurs to create a plasma 26, which is irradiated with the ion beams 31 to produce the same effect as in the first and second embodiments.

Fourth Embodiment

A fourth embodiment of the invention will be described with reference to FIG. 4.

Figure 4A:
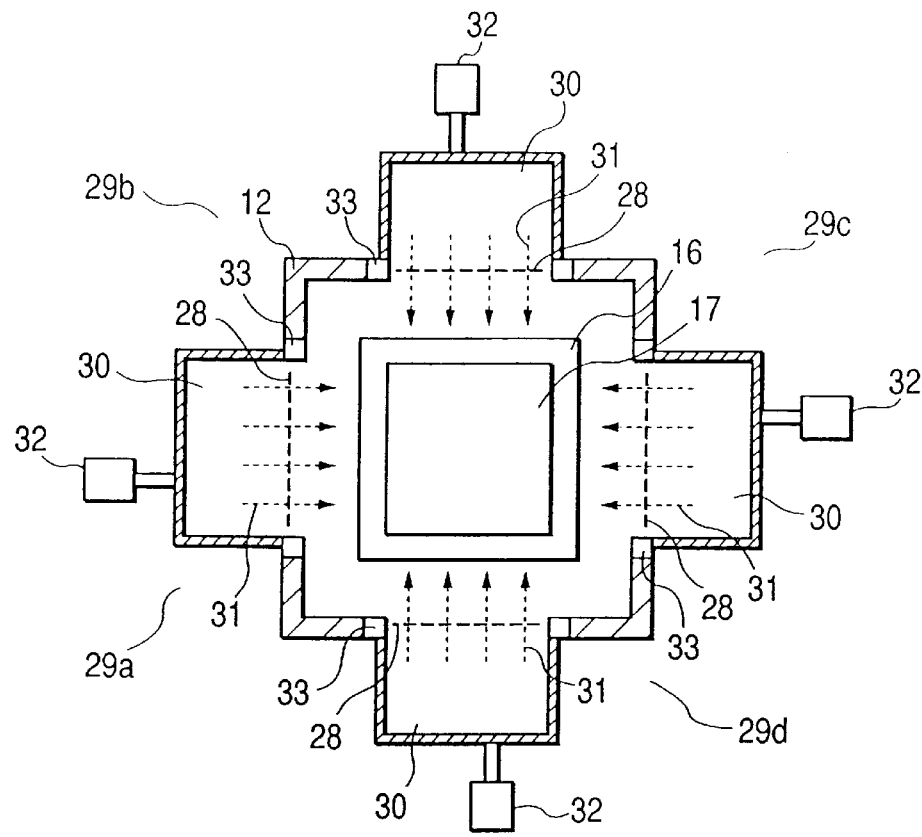
FIG. 4A is a horizontal section view of a thin film forming apparatus according to a fourth embodiment of the invention.
Figure 4B:
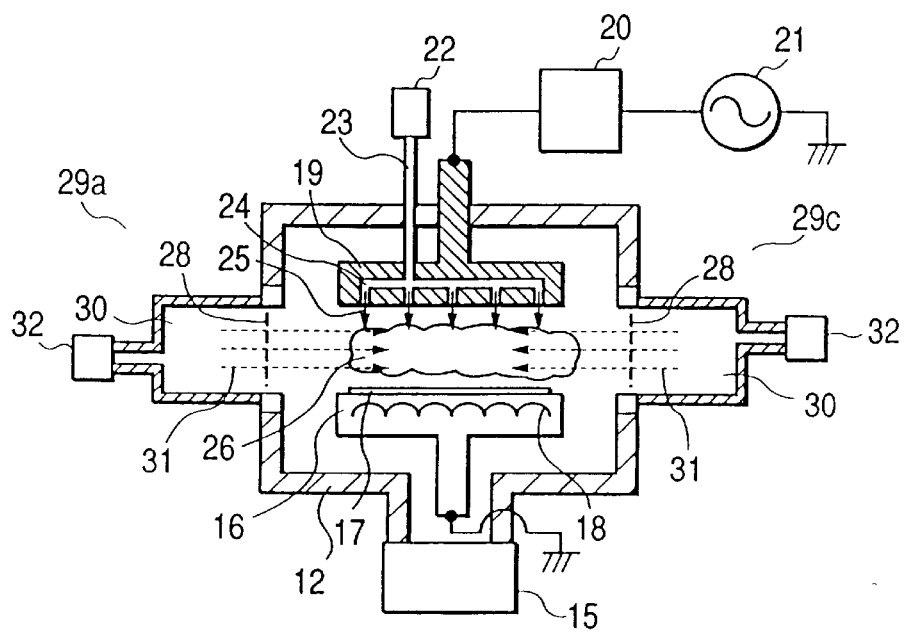
FIG. 4B is a vertical section view of the same apparatus shown in FIG. 4A.

FIG. 4A is a horizontal section through the apparatus and FIG. 4B is a vertical section through the apparatus. A vacuum chamber 12 in a rectangular prism shape is surrounded by four ion sources 29a, 29b, 29c and 29d that have the same configuration as the ion source 29 in FIG. 1. An evacuation unit 15 is provided below the vacuum chamber 12.

The four ion sources 29a to 29d are provided to substantially surround the plasma 26. Ion beams 31 irradiating from these ion sources are incident parallel to the substrate 17. Hence, the plasma 26 is efficiently irradiated with a large amount of ion beams 31. Accordingly, it is possible to obtain a desired thin film of even better crystallinity to be formed on the substrate 17.

If desired, the ion source may be provided on only two opposed sides of the vacuum chamber 12.

If the vacuum chamber 12 is not in a rectangular prism shape but assumes other shapes such as a cylinder, a plurality of ion sources may be spaced around the vacuum chamber and even in this case the same effect is obtained.

The respective ion sources may be provided in such a way that they produce ion beams that are directed downward at an angle. In this alternative case, the substrate is irradiated with part of the ion beams, enabling the formation of an even more satisfactory thin film.

Fifth Embodiment

A fifth embodiment of the invention will be described with reference to FIG. 5.

Figure 5A:
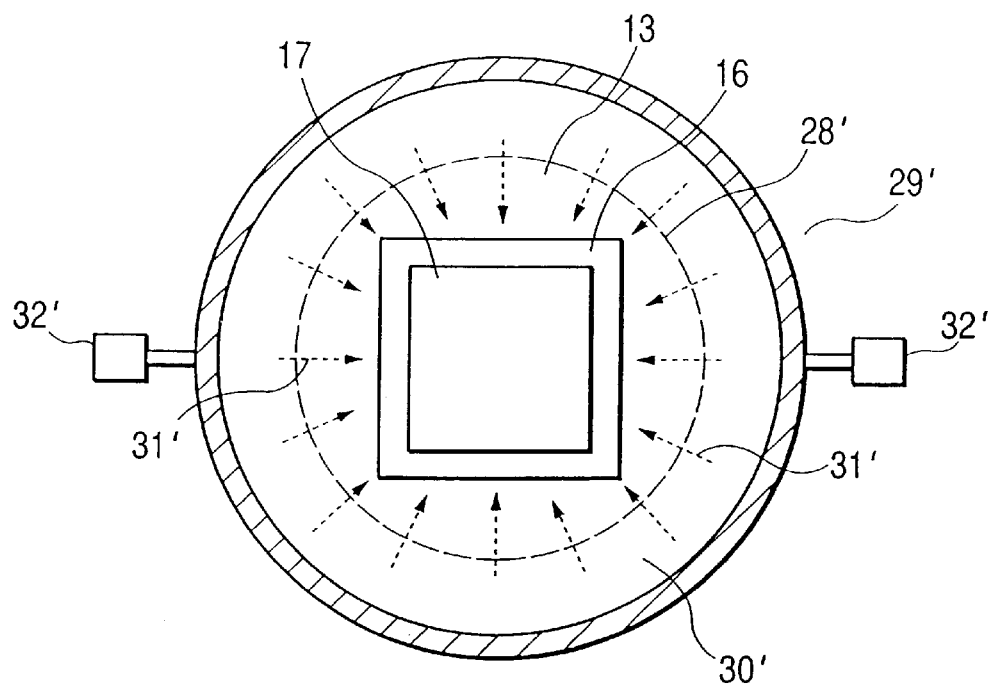
FIG. 5A is a horizontal section view of a thin film forming apparatus according to a fifth embodiment of the invention.
Figure 5B:
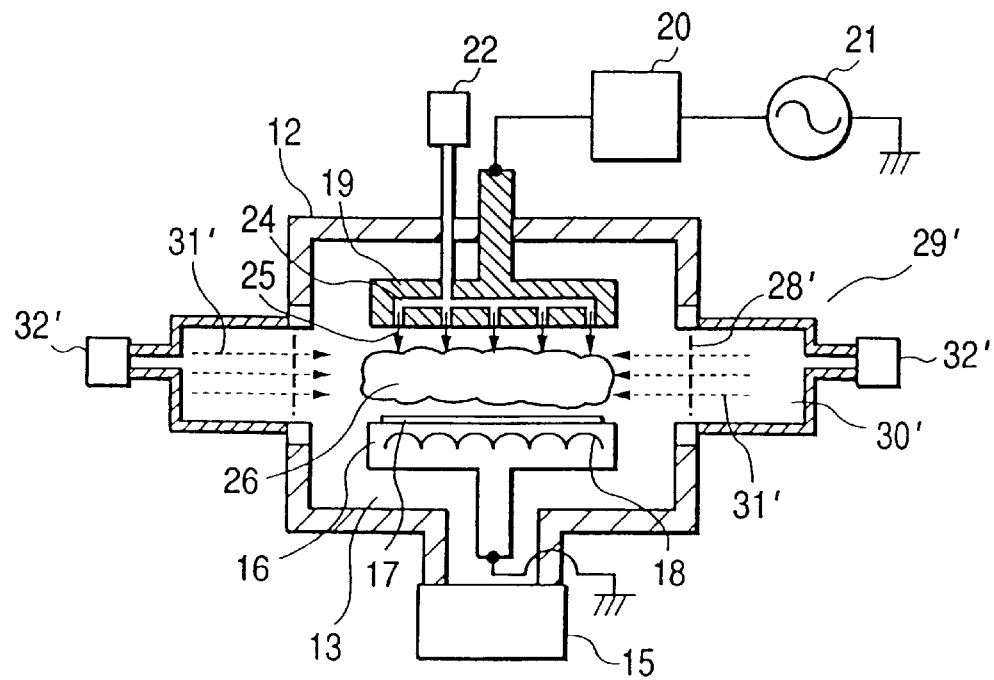
FIG. 5B is a vertical section view of the same apparatus of FIG. 5A.

FIG. 5A is a horizontal section through the apparatus and FIG. 5B is a vertical section through the apparatus. The apparatus shown in FIG. 5 has a cylindrical vacuum chamber 12 which is entirely surrounded by an annular plasma chamber 30' which, in turn, is supplied with an ion source gas from a plurality of ion source introducing, gas supply units 32'.

In this fifth embodiment, the plasma 26 is irradiated with ion beams 31' that come from all directions to be incident parallel to the substrate 17. Hence, even more efficient and extensive irradiation of the plasma 26 with the ion beams 31' is achieved to enable the formation of a thin film of very good quality.

As in the first to fourth embodiments, the ion sources 29' may be provided in a higher position than the plasma 26 so that the ion beams 31' are applied downward at an angle.

The present invention offers the following advantages.

Ion beams 31 are drawn out such that they are directed either parallel to or at an angle with the film-forming surface of the substrate 17 but that they are not incident perpendicular to the substrate 17. Therefore, the substrate 17 is not damaged by irradiation with the ion beams 31 and a satisfactory thin film can be deposited on its film-forming surface even if the ion beams 31 are drawn out at high voltage.

The plasma 26 formed above the substrate 17 is irradiated with ion beams 31 that come from a plurality of radial directions to be incident either parallel to or at an angle with the substrate 17, ensuring that the bombardment of the ion beams 31 against the surface of the substrate 17 is reduced to the lowest possible level while the plasma 26 above the substrate 17 is irradiated with a large amount of the ion beams 31. Hence, the throughout of irradiation of the plasma with the ion beams 31 is sufficiently increased to offer an additional advantage such as a further improvement in the crystallinity of the thin film being deposited.

According to claim 3, the plasma 26 formed above the substrate 17 is irradiated with ion beams 31 that come from all directions to be incident either parallel to or at an angle with the substrate 17, ensuring that the bombardment of the ion beams 31 against the surface of the substrate 17 is reduced to the lowest possible level while the plasma 26 above the substrate 17 is irradiated with a very large amount of the ion beams. This offers an additional advantage such as an even more significant improvement in various properties such as the crystallinity of the thin film being formed.

What is claimed is:

1. A thin film forming apparatus comprising:

a vacuum chamber as a film forming chamber in which a substrate is placed, a thin film being formed on the substrate;

plasma generating means for decomposing a source gas introduced into said vacuum chamber to generate a plasma of said source gas near a film-forming surface of the substrate within said vacuum chamber; and ion producing means, which is positioned substantially between the plasma generating means and the substrate, for producing ion beams that are drawn out to be directed substantially parallel to the film-forming surface of the substrate to irradiate the plasma.

2. A thin film forming apparatus comprising:

a vacuum chamber as a film forming chamber in which a substrate is placed, a thin film being formed on the substrate;

plasma generating means for decomposing a source gas introduced into said vacuum chamber to generate a plasma of said source gas near a film-forming surface of the substrate within said vacuum chamber; and ion producing means, which is provided around said vacuum chamber, for producing ion beams that are drawn out to be directed substantially parallel to or at an angle other than perpendicular to the film-forming surface of the substrate to irradiate the plasma;

wherein said ion producing means comprises a plurality of ion sources which are positioned at a plurality of sites around said vacuum chamber, the sites being selected to permit irradiation of the plasma near the film-forming surface of the substrate with the ion beams coming from a plurality of directions.

3. A thin film forming apparatus comprising:

a vacuum chamber as a film forming chamber in which a substrate is placed, a thin film being formed on the substrate;

plasma generating means for decomposing a source gas introduced into said vacuum chamber to generate a plasma of said source gas near a film-forming surface of the substrate within said vacuum chamber; and ion producing means, which is provided around said vacuum chamber, for producing ion beams that are drawn out to be directed substantially parallel to or at an angle other than perpendicular to the film-forming surface of the substrate to irradiate the plasma;

wherein said ion producing means is an ion source which that is provided in an annular form surrounding said vacuum chamber so that the plasma near the film-forming surface of the substrate is irradiated with the ion beams coming from all radial directions.

* * * * *